(12) United States Patent
Honda

(10) Patent No.: US 7,359,172 B2
(45) Date of Patent: Apr. 15, 2008

(54) JUNCTION TEMPERATURE SENSING FOR MOSFET

(75) Inventor: Jun Honda, El Segundo, CA (US)

(73) Assignee: International Rectifier Corporation, El Segundo, CA (US)

(*) Notice: Subject to any disclaimer, the term of this patent is extended or adjusted under 35 U.S.C. 154(b) by 25 days.

(21) Appl. No.: 11/485,892

(22) Filed: Jul. 13, 2006

(65) Prior Publication Data
US 2007/0014067 A1 Jan. 18, 2007

Related U.S. Application Data

(60) Provisional application No. 60/699,178, filed on Jul. 14, 2005.

(51) Int. Cl.
H02H 5/04 (2006.01)
(52) U.S. Cl. ...................................................... 361/103
(58) Field of Classification Search ............... 361/93.7, 361/93.8, 103
See application file for complete search history.

(56) References Cited

U.S. PATENT DOCUMENTS

| 5,959,464 A | * | 9/1999 | Qualich ....................... 324/769 |
| 6,917,503 B2 | * | 7/2005 | Dai et al. ................... 361/93.1 |
| 6,987,655 B2 | * | 1/2006 | Kesler et al. ............... 361/103 |
| 2006/0028257 A1 | * | 2/2006 | Huang et al. ............... 327/175 |

* cited by examiner

Primary Examiner—Michael Sherry
Assistant Examiner—Lucy Thomas
(74) Attorney, Agent, or Firm—Ostrolenk, Faber, Gerb & Soffen, LLP

(57) ABSTRACT

A method of protecting a MOSFET switch from overheating. The method is achieved by determining a ratio of ON resistance of the switch to resistance of a sense resistor, the sense resistor being series coupled in the source-drain circuit of the switch. Further, the ratio is compared to a reference signal and an output signal is generated when the ratio exceeds the reference signal.

13 Claims, 2 Drawing Sheets

JUNCTION TEMPERATURE SENSING FOR MOSFET

CROSS-REFERENCE TO RELATED APPLICATION

This application is based on and claims the benefit of U.S. Provisional Application Ser. No. 60/699,178, filed on Jul. 14, 2005, entitled JUNCTION TEMPERATURE SENSING FOR MOSFET, to which a claim of priority is hereby made and the disclosure of which is incorporated by reference.

BACKGROUND OF THE INVENTION

The present invention relates to means for protecting circuits from damage due to temperature, and more particularly to a circuit for measuring the junction temperature of a MOSFET in real time.

SUMMARY OF THE INVENTION

It is an object of the present invention to provide a method for protecting a MOSFET switch from overheating. The method is achieved by determining a ratio of ON resistance of a switch ($R_{DS}(ON)$) to the resistance of a sense resistor, the sense resistor being series coupled with the source-drain circuit of the switch. Further, the ratio is compared to a reference signal and an output signal is generated when the ratio exceeds the reference signal.

Other features and advantages of the present invention will become apparent from the following description of the invention that refers to the accompanying drawings.

DETAILED DESCRIPTION OF EMBODIMENTS OF THE INVENTION

Figure 1:
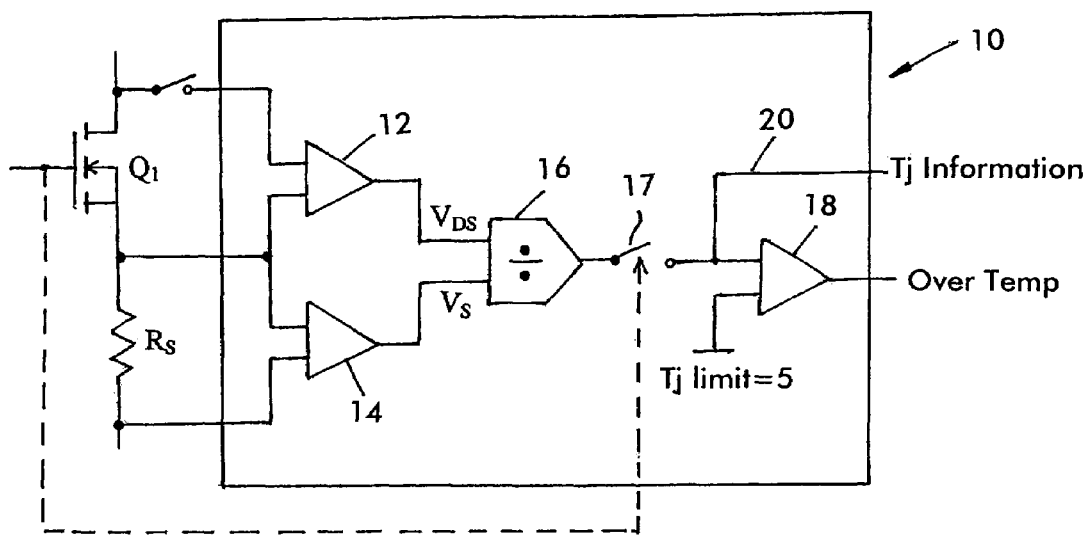
FIG. 1 is a diagram of a circuit for determining the temperature of a transistor switch $Q_1$ in accordance with an embodiment of the present invention.

With reference to FIG. 1, a circuit 10 is provided for determining the temperature of a transistor switch $Q_1$, e.g., a MOSFET. A sense resistor $R_S$ is coupled in series in the drain or source circuit of the switch $Q_1$. A first amplifier 12 is coupled across the switch $Q_1$ for determining the voltage across the drain and source terminals of the switch $Q_1$ which is proportional to $R_{DS}(ON)$. A second amplifier 14 is coupled across the resistor $R_S$ for determining the voltage across the sense resistor $R_S$.

To compare the voltage across the sense resistor $R_S$ to the voltage across $R_{DS}(ON)$, outputs of the first and second amplifiers 12 and 14 are provided to a divider circuit 16. The divider circuit 16 provides a ratio signal of $V_{DS}$ to $V_S$ to a comparator 18. The comparator 18 is also provided with a reference signal $T_J$ limit so that it may determine the temperature at which an overtemperature signal should be issued. An overtemperature signal is issued from the comparator 18 if the ratio received from the divider 16 exceeds a predetermined threshold $T_J$ limit (the reference signal), for example, a ratio of 5. The junction temperature information can also be provided to another circuit by line 20. A switch 17 coupled the divider circuit 16 output and the comparator 18 input and is divided whenever there is gate drive to switch $Q_1$.

Figure 2:
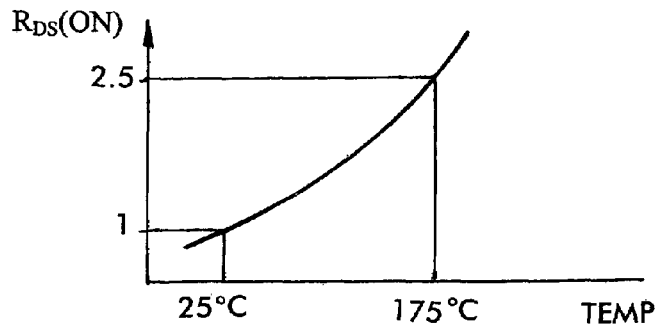
FIG. 2 is a graph of a typical curve $R_{DS}(ON)$ plotted versus temperature.

FIG. 2 shows a typical curve $R_{DS}(ON)$ plotted versus temperature. Since $R_S$ is fixed, as $R_{DS}(ON)$ changes, the ratio $R_{DS}(ON)/R_S = V_{DS}/V_S$ also changes. From the ratio determined by the divider 16, the junction temperature can be determined. For example, if $R_S = 0.5\ R_{DS}(ON)$ when the ratio $R_{DS}(ON)/R_S = 2$, as shown in FIG. 2, the junction temperature ($T_J$) is determined to be 25° C. When the ratio $R_{DS}(ON)/R_S = 5$, ($R_{DS}(ON) = 2.5$) the junction temperature is determined to be 175° C. In the illustrated embodiment, if the predetermined threshold $T_J$ limit is 5, an overtemperature signal will be issued indicating that at this temperature 175° C. further circuit operation should be avoided.

Figure 3:
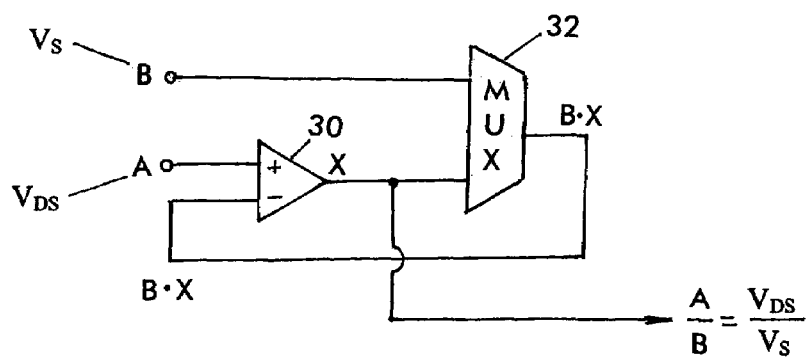
FIG. 3 is a diagram of a circuit for determining a ratio measurement for sensing the junction temperature $T_J$.

FIG. 3 shows an embodiment for determining the ratio measurement for sensing the junction temperature $T_J$. Two signals A and B are provided. The signal A is provided to an amplifier 30 and the signal B is provided to multiplier 32. The output of the multiplier 32 is B*X. With the loop closed, B*X is fed to the negative input terminal of the amplifier 30. Since the two inputs of the amplifier 30 follow each other, A=B*X, therefore the output X is equal to A/B when B is not equal to zero.

Figure 4:
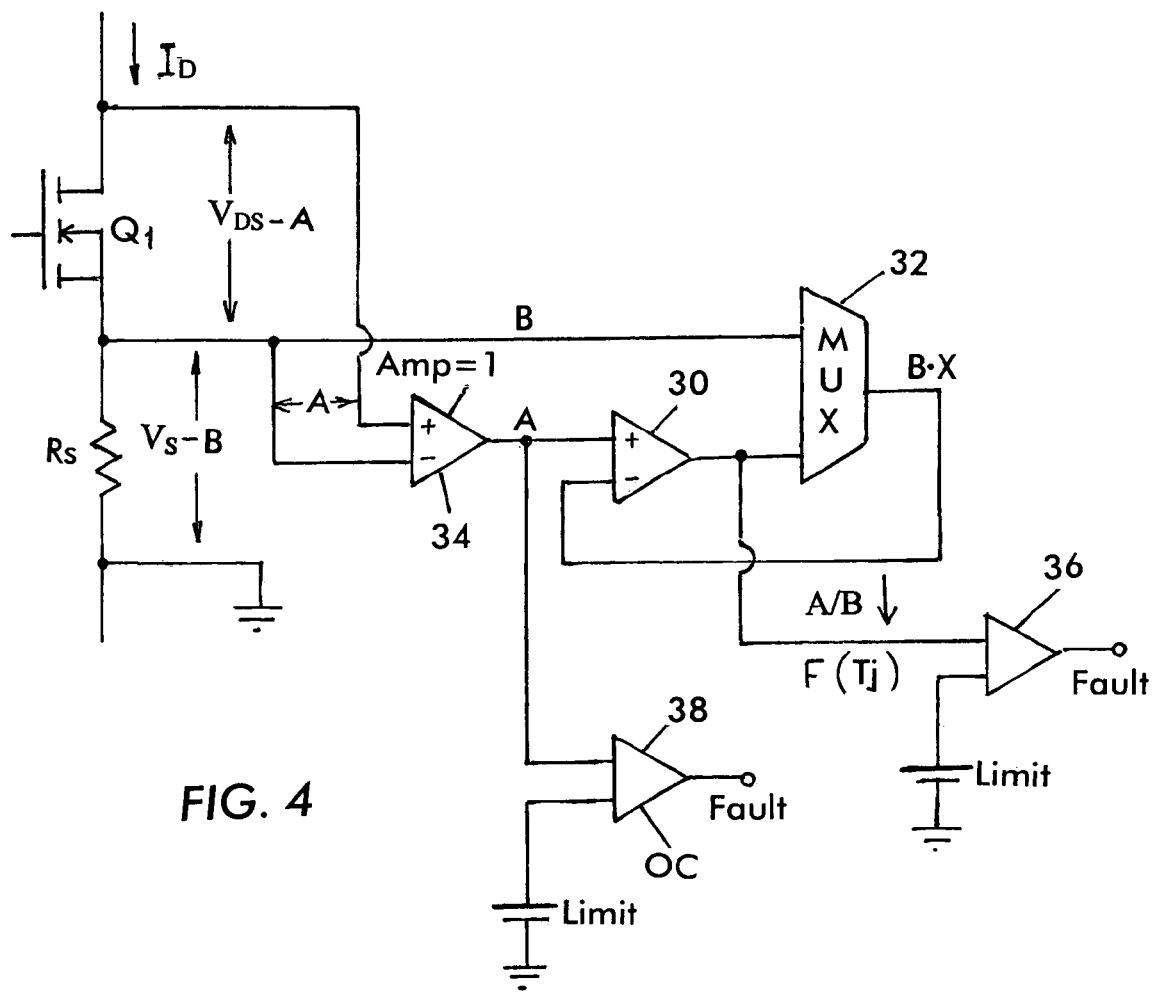
FIG. 4 is a diagram of a circuit for determining the temperature of a transistor switch using the ratio measurement illustrated in FIG. 3.

FIG. 4 shows one implementation of the junction temperature $T_J$ sensing circuit using the division circuit of FIG. 3 and the signal $A = V_{DS}$ and the signal $B = V_S$. As above, $$f(T_j)\frac{V_{DS(ON)}}{V_S} = \frac{R_{DS(ON)}}{R_S} = \frac{I_D \times R_{DS(ON)}}{I_D \times R_S}.$$

The output of the amplifier 34 having an amplification factor of A=1 is A. This output, i.e., A, is fed to the amplifier 30. The inverting input of the amplifier 30 is provided to the output of the multiplier stage 32, which provides a closed loop output B*X. Therefore X is equal to A/B.

The signal X, which is equal to A/B, is provided to a comparator 36, which in turn issues a fault condition when the junction temperature exceeds the limit set at the reference input. An overcurrent comparator 38 is also provided to generate a fault signal if A or $V_{DS}$ has exceeded some predetermined current limit, e.g., $I_D$, which is provided to the overcurrent comparator 38 as the second input.

Figure 5:
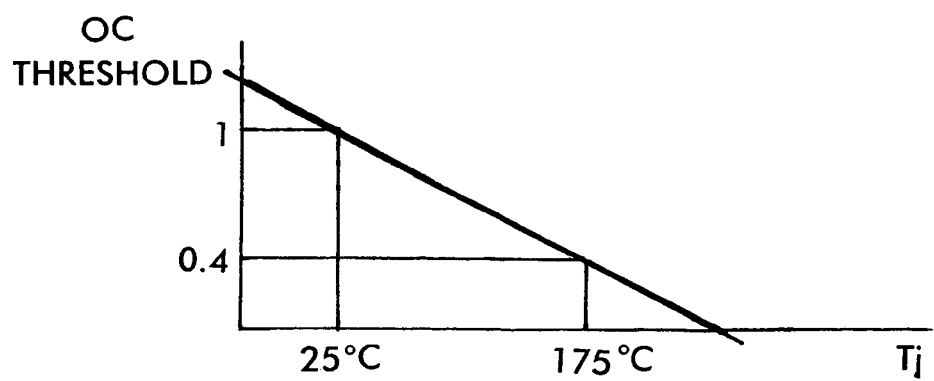
FIG. 5 is a graph of an overcurrent sensing comparator plotting the junction temperature $T_J$ vs. overcurrent threshold.

FIG. 5 shows the operation of the overcurrent sensing comparator 38 OC. The signal A equal to $V_{DS}$ is compared to a current limit by the overcurrent comparator 38 and if it exceeds the limit, an overcurrent condition is also generated. The graph of FIG. 5 shows the overcurrent threshold OC versus junction temperature. The combination of overcurrent via comparator 38 and junction temperature fault sensing via comparator 36 gives very good protection for the switch.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A method of protecting a MOSFET switch from overheating, the method comprising the steps of:
   determining a ratio of ON resistance of the switch to resistance of a sense resistor, the sense resistor being series coupled in the source-drain circuit of the switch;
   comparing the ratio to a reference signal; and
   generating an output signal when the ratio exceeds the reference signal.

2. The method of claim 1, wherein values of the ratio correspond to junction temperatures of the switch.

3. The method of claim 1, wherein the reference signal corresponds to a predetermined threshold of a junction temperature of the switch.

4. The method of claim 1, wherein the output signal indicates overheating of the switch.

5. A circuit for providing an overcurrent protection of a MOSFET switch, the circuit comprising:
   a sense resistor coupled in series with the switch,
   a first amplifier coupled across the switch,
   a second amplifier coupled across the sense resistor,
   a divider circuit coupled to outputs of the first and second amplifiers for generating a ratio signal,
   a comparator coupled to an output of the divider circuit and to a reference signal,
   wherein the comparator generates an output signal when the ratio exceeds the reference signal.

6. The circuit of claim 5, wherein values of the ratio correspond to junction temperatures of the switch.

7. The circuit of claim 5, wherein the reference signal corresponds to a predetermined threshold of a junction temperature of the switch.

8. The circuit of claim 5, wherein the output signal indicates overheating of the switch.

9. The circuit of claim 5, wherein the divider circuit includes a multiplier having a first input from the second amplifier and a second input from a third amplifier, the third amplifier receiving an input from the first amplifier and another input via a closed loop from the multiplier output, whereby the third amplifier generates the ratio.

10. A circuit for providing an overcurrent protection of a switch, the circuit comprising:
    a sense resistor coupled in series with the switch;
    a first amplifier coupled across switch; and
    a multiplier having a first input coupled to a junction between the sense resistor and the switch and a second input from a second amplifier, the second amplifier receiving an input from an output of the first amplifier and a second input from the multiplier output via a closed loop.

11. The circuit of claim 10, wherein the second amplifier generates an output signal proportional to a ratio of an ON resistance of the switch to the resistance of the sense resistor.

12. The circuit of claim 11, further comprising a fault comparator receiving as a first input the output signal and as a second input a reference signal and generating a fault output signal when the ratio exceeds the reference signal.

13. The circuit of claim 10, further comprising an overcurrent comparator for generating an overcurrent signal if it is determined that a signal proportional to a voltage across the switch has exceeded a predetermined current limit provided to the overcurrent comparator as the second input.

* * * * *